United States Patent [19]

Winter et al.

[11] Patent Number: 5,409,735

[45] Date of Patent: Apr. 25, 1995

[54] CHEMICAL VAPOR DEPOSITION OF METAL PNICTOGENIDE FILMS USING SINGLE SOURCE PRECURSORS

[75] Inventors: Charles H. Winter, Grosse Point Park; T. Suren Lewkebandara, Detroit; Philip H. Sheridan, Madison Heights, all of Mich.

[73] Assignee: Wayne State University, Detroit, Mich.

[21] Appl. No.: 278,566

[22] Filed: Jul. 21, 1994

Related U.S. Application Data

[63] Continuation of Ser. No. 985,099, Nov. 30, 1992.

[51] Int. Cl.$^6$ ............................................. C23C 16/34
[52] U.S. Cl. ................................... 427/248.1; 427/255
[58] Field of Search ............................. 427/248.1, 255

[56] References Cited

U.S. PATENT DOCUMENTS

| | | |
|---|---|---|
| 4,535,000 | 8/1985 | Gordon . |
| 4,585,674 | 4/1986 | Gordon . |
| 4,623,400 | 11/1986 | Japka et al. . |
| 4,803,127 | 2/1989 | Hakim . |
| 4,977,106 | 12/1990 | Smith . |

FOREIGN PATENT DOCUMENTS 210058  9/1985  Japan .

OTHER PUBLICATIONS

Biunno, N. et al., Low Temperature Processing of Titanium Nitride Films by Laser Physical Deposition Appl. Phys Lett 54(16) 17 Apr. 1989 pp. 1519–1521.
Shizhi, L. et al. Plasma Chemical Vapor Deposition of Tin Plasma Chemistry and Plasma Processing vol. 4 No. 3 1984 pp. 147–161.
Webster's New Collegiate Dictionary 1961 p. 16.
Fowles, G. W. A. et al., Studies on the Behavior of Halides of the Transition Metals with Ammonia . . . Tetrachloride with Ammonia, 1953, pp. 2588–2593.
Sugiyama, Kozoh et al., Low Temperature Deposition of Metal Nitrides . . . Compounds, J. Electrochem. Soc.: Solid-State Science and Technology, Nov. 1975, pp. 1545–1549.
Saaeki, Yuzo et al., Reaction Process of Titanium Tetrachloride with . . . Formed, Bull. Chem. Soc. Jpn., vol. 55, No. 10, Oct. 1982, pp. 3193–3195.
Kurtz, S. H. et al., Chemical Vapor Deposition of Titanium Nitride at Low Temperatures Thin Solid Films, 140 (1986), pp. 277–291.
Fix, Renaud et al., Synthesis of Thin Films by Atmospheric Pressure Chemical . . . Precursors, Chem. Mater., vol. 2, No. 3, 1990, pp. 235–241.
Fix, Renaud M. et al., Solution–Phase Reactivity as a Guide to the Low–Temperature Chemical . . . Films, J. Am. Chem. Soc., vol. 2, No. 21, 1990, pp. 7833–7835.
Aguero, A. et al., A Low Temperature CVD Process for TiN Coatings, Mat. Res. Soc. Symp. Proc., vol. 168, 1990, Materials Research Society, pp. 311–316.
Fix, Renaud M., Titanium Nitride Thin Films: Properties and APCVD Synthesis Using . . . Precursors, Mat. Res. Soc. Symp. Proc. vol. 168, 1990, pp. 357–362.
Fix, Renaud et al., Chemical Vapor Deposition of Titanium, Zirconium, and Hafnium Nitride Thin Films, Chem. Mater., vol. 3, 1991, pp. 1138–1142.
Proscia, J., The Synthesis of Nitride Films from the Reaction of Amines . . . Halides. Presented at 4th Chem. Con. of N. America, NY, N.Y., Aug. 25–30 1991 (Abstract Only).
Winter, Charles H. et al., A Single–Source Precursor to Titanium Nitride Thin Films. Evidence . . . Process, J. Am. Chem. Soc., vol. 114, No. 3, 1992, pp. 1095–1097.
Z. Y. Chen, A. W. Castleman, Jr., "J. Chem. Phys.", 1993, 98, pp. 231–235.

*Primary Examiner*—Shrive Beck
*Assistant Examiner*—Bret Chen
*Attorney, Agent, or Firm*—Brooks & Kushman

[57] ABSTRACT

A process for depositing a film of metal pnictogenide. The process comprises providing a single source of a metal pnictogenide and heating said source to a temperature sufficient to sublime the single source at a pressure selected from a range of about 0.0001 to 760 torr so that a sublimate is delivered into a reaction zone. Within this reaction zone, a substrate is provided upon which deposition may occur. The reaction zone is heated to approximately 200°–800° C. The sublimate is passed through this reaction zone and over the substrate to produce a thin film of metal pnictogenide which is deposited upon the substrate.

17 Claims, 1 Drawing Sheet

CHEMICAL VAPOR DEPOSITION OF METAL PNICTOGENIDE FILMS USING SINGLE SOURCE PRECURSORS

This is a continuation of copending application Ser. No. 07/985,099, filed on Nov. 30, 1992.

TECHNICAL FIELD

The present invention relates to the deposition of metal pnictogenide films onto a substrate through the use of chemical vapor deposition techniques utilizing a single source of a metal pnictogenide.

BACKGROUND ART

Metal pnictogenide films have attracted considerable attention due to their many desirable properties. Metal pnictogenides such as titanium nitride, zirconium nitride and hafnium nitride exhibit metallic behavior, extreme hardness, high melting point (ca 3000° C.), chemical resistance to organic solvents and inorganic acids to the point of inertness, and low temperature super conductivity. As a result, metal pnictogenide films are suitable for many applications. Well known examples include wear resistant, friction reducing coatings for machine tools and gold colored decorative coatings.

In addition, the optical properties of metal pnictogenides make them suitable for use as wave length-selective transparent optical films and solar control coatings for windows. In microelectronic devices, metal pnictogenide films are of use as low resistance contacts and diffusion barriers that interconnect metallization schemes. See Fix et al. *Chemical Vapor Deposition of Titanium, Zirconium, and Hafnium Nitride Films*, CHEM. MATERIALS, (1991), 3, pp. 1138–1148, herein incorporated by reference.

Metal pnictogenide films have been prepared by chemical vapor deposition techniques (CVD) and physical vapor deposition (PVD) techniques such as sputtering and reactive evaporation. However, these prior art processes fail to consistently provide high quality films exhibiting low resistivity, low levels of contamination from other elements and highly reflective gold colored films. In addition, most of these prior art CVD processes require the use of an excess of vaporous ammonia in combination with either a metal halide or a metal dialkylamide.

The deposition of titanium nitride films from the reaction of vaporous titanium tetrachloride and vaporous ammonia has been explored in a variety of reaction conditions. For example see Y. Saeki et al., *Reaction Process Of Titanium Tetrachloride With Ammonium And The Vapor Phase And Properties Of The Titanium Nitride Formed*, BULL. OF THE CHEM. SOC. OF JPN., (1982), 55, pp. 3193–3196; A. Aguero et al., *A Low Temperature CVD Process For Tin Coatings*, MAT. RES. SOC. SYMP. PROC., (1989), 168, pp. 311–316; and S. R. Kurtz and R. Gordon, *Chemical Vapor Deposition Of Titanium Nitride At Low Temperatures*, THIN FILMS, (1986), 140, pp. 277–290. These references are herein incorporated by reference.

However, these prior art processes fail to produce the desired high quality titanium nitride films. In particular, films produced by these prior art processes lack the characteristic highly reflective gold color, the desired one to one stoichiometry, and are contaminated with significant amounts of carbon and chlorine.

Metal pnictogenide films of titanium, zirconium and hafnium have also been produced using a multi-reactant feed stream of vaporous ammonia and vaporous tetrakis (dialkylamido) metal (IV) complexes. However, although the titanium nitride film produced by this process possessed the requisite highly reflective gold colored appearance, high purity films were obtained only at deposition temperatures of approximately 200° C. Increasing deposition temperature resulted in increased contamination. Also, the titanium nitride films produced by this process possessed slightly nitrogen rich stoichiometry.

These prior art processes are also handicapped due to an extreme vulnerability to fluctuations in certain experimental parameters. Kurtz and Gordon reported that deposition of high quality TiN films was dependent upon careful control of the vaporous reactant mixing conditions. Failure to exercise this 'careful control' resulted in the formation of powder. See, Kurtz et al., *CVD Of TiN At Low Temperatures*, THIN Solid FILMS, (1986), 140, pp. 277–290. Other experimental variables having a significant impact upon the successful CVD of metal pnictogenide films using multi reactant feed streams are the gas flow rates, pressure, reactant concentration and deposition temperature.

In addition to these practical difficulties, these multiple reactant CVD processes are undesirable because of the excess ammonia required. Due to ammonia's toxicity and hazardous handling properties, its presence in a commercial process is highly undesirable. While at least one prior art reference discloses the production of metal pnictogenide films using metal chloride and excess primary and secondary amines, the substitution of ammonia with an excess of selected primary and secondary amines in no way addresses the practical difficulties of using such compounds in a commercial industrial process.

As a result of the deficiencies of the prior art processes, CVD processes employing a single reactant stream for the production of metal pnictogenide films are desirable. While some single sources for metal pnictogenide films have been reported, they fail to produce the desired high quality metal pnictogenide films.

For example, in two prior art references, Fix et al. *Synthesis of Thin Films By Atmospheric Pressure Chemical Vapor Deposition Using Amido And Imido Titanium (IV) Compounds As Precursors*, CHEM. MATER., (1990), 3, pp. 235–241 and Sugiyama et al. *Low Temperature Deposition Of Metal Nitride By Thermal Decomposition Of Organo Metallic Compounds*, J. ELECTRO. CHEM. ASSOC.: SOLID STATE SCIENCE AND TECHNOLOGY, (November 1975), 122, pp. 1545–1549, the use of metal tetrakis (dialkylamides) are disclosed as single source precursors for metal pnictogenide films. These references, which are herein incorporated by reference, indicate that the resultant films suffer from significant oxygen and carbon contamination and appear to lack the desirable mirror-like golden appearance. Both references also indicate that no film is produced at deposition temperatures less than 350° C.

Accordingly, then what is desired is a single source precursor for use in CVD reactors which will produce metal pnictogenide films, particularly titanium nitride films, which are gold colored and possess high reflectivity, negligible contamination from other atomic species such as carbon, oxygen or chlorine, and low resistivity. Suitable metal pnictogenide single sources will produce a film having the desired stoichiometry, be volatile at temperatures less than 100° C. and cleanly decompose to the desired product.

SUMMARY OF THE INVENTION

The problems and limitations of the prior art have been overcome with the invention disclosed herein. The invention comprises a process for depositing a film of a metal pnictogenide having the steps of providing a single source of the metal pnictogenide, heating the single source to temperatures sufficient to sublime the single source at a pressure selected from a range of about 0.0001 to 760 torr so that a sublimate is delivered into a reaction zone, affording a substrate within the reaction zone to define a surface upon which deposition may occur, heating the reaction zone to a temperature selected from a range of about 200° to 800° C. and passing the sublimate over the substrate to deposit a film of the metal pnictogenide on the substrate.

It is an object of the invention to provide a single source precursor containing the required stoichiometric ratio of elements, which is volatile at temperatures less than 100° C., and which cleanly decompose to produce the desired metal pnictogenide film.

It is also an object of the invention to provide a CVD process which eliminates the need for an excess amount of ammonia or amine.

A further object of the invention is to provide a CVD process which produces a metal pnictogenide film at pressures lower than ambient atmospheric pressure.

In satisfying the above-mentioned objects, a single source is provided which is the reaction product of $MX_n$ and a reactant selected from the group consisting of $NH_3$, $NHR_2$, $NR_3$ and mixtures thereof, wherein M is selected from the group consisting of Ti, Zr, Hf, Z, Nb, Ta, Cr, Mo, and W, n is a number from 3 to 6, X is a halide, and R is a substituent group containing from 1 to 18 carbon atoms. This material is sublimed and is delivered in the gaseous phase to a heated substrate which is supported within a reaction zone. Upon heating the reaction zone to a temperature between 200° C. to 800° C. the substrate is coated with the desired metal pnictogenide film. Any material not deposited as a film on the desired substrate passes through the reactor and is subsequently entrapped to minimize adverse environmental consequences.

BEST MODE FOR CARRYING OUT THE INVENTION

Figure 1:
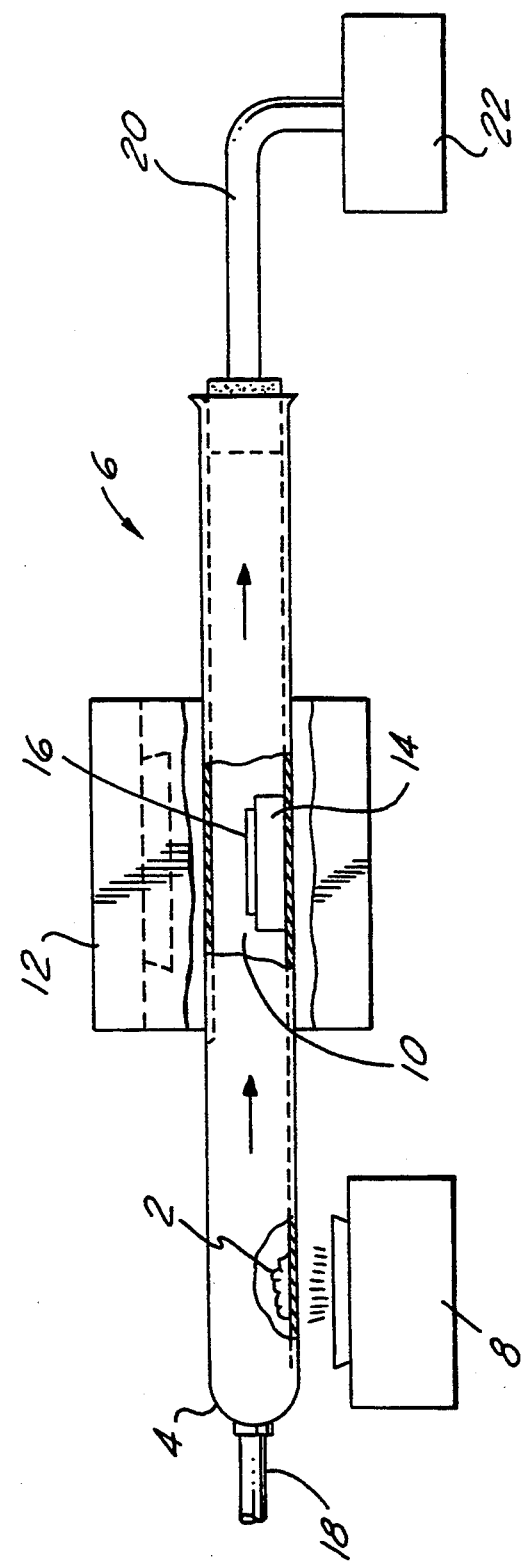
FIG. 1 provides a side view of a preferred embodiment of the CVD reactor used herein.

The CVD process of the instant invention achieves the preceding objects and provides further advantages with the use of a particular group of single sources for metal pnictogenides. The single sources of the invention may be characterized as the reaction product of reactants A and B, wherein A is $Mx_n$ and B is a reactant selected from the group consisting of ammonia ($NH_3$), secondary amines ($NHR_2$), tertiary amines $NR_3$ and mixtures thereof. M is preferably a metal selected from either the titanium, vanadium, or chromium families wherein the titanium family consists of titanium, zirconium, and hafnium; the vanadium family consisting of vanadium, niobium and tantalum; and the chromium family consists of chromium, molybdenum, and tungsten. M will preferably be selected from the group consisting of titanium, zirconium, hafnium, vanadium, and niobium. Most preferably, M will be titanium. X is a halide where halide is defined as the group consisting of fluorine, chlorine, bromine, and iodine. Most preferably X will be chlorine. n may be a number from 3 to 6 and most preferably will be 4.

In view of the wide number of acceptable metals and halides, there are many possibilities for reactant A. Preferably $MX_n$ will be selected from the group consisting of titanium trihalide, titanium tetrahalide and titanium hexihalide. Most preferably $MX_n$ will be titanium tetrahalide.

Reactant B is to be selected from the group consisting of $NH_3$, $NHR_2$, $NR_3$ and mixtures thereof. It is most preferred that reactant B be $NH_3$. However, it is within the scope of the invention that $NHR_2$ and $NR_3$ are acceptable reactants for the production of the desired single source. When B is $NHR_2$ or $NR_3$, R is a substituent group containing from 1 to 18 carbon atoms. It will be appreciated by those skilled in the art that R may be a substituent group selected from the group consisting of alkyl groups, alkene groups, aromatic and heterocyclic groups.

Suitable alkyl groups are methyl, ethyl, propyl, and the isomers of butane, pentane, hexane, etc. It will be appreciated that suitable alkyl groups having from 1 to 18 carbons may be linear or branched and that there are a large number of suitable isomers. Preferably R will be an alkyl group having from 1 to 5 carbons such as methyl, ethyl, and the various isomers of propyl, butyl and pentyl. Most preferably R will be an ethyl (Et) or isopropyl (i-Pr) group.

Suitable alkenes may be selected from the group of branched or linear molecules having from 2 to 18 carbons and possessing at least 1 carbon-carbon double bond. A preferred alkene is the vinyl group.

R may also be a phenyl group or a substituted phenyl such as the tolyl group, the xylyl group or mesityl group. Heterocylic groups such as 2-pyridyl are also suitable.

Thus it will be appreciated that while a variety of single sources for metal pnictogenides may be prepared according to the instant invention, most preferably single sources for titanium nitride films will be obtained. Most preferably reactant A will be titanium tetrachloride. Similarly, while reactant B may be ammonia or a secondary or tertiary amine it will most preferably be ammonia. However, if the reactant B is a secondary or tertiary amine it is most preferred that R be an alkyl group having from 1 to 18 carbon atoms and will most preferably be either ethyl or isopropyl.

The preparation of the single source precursors will occur by reacting reactant A with a reactant B in an organic solvent. Suitable organic solvents include alkane solvents such as hexane, aromatic solvents such as benzene and toluene, and halogenated solvents such as dichloromethane. It is most preferable that dichloromethane be used.

When reactant A is titanium tetrachloride and reactant B is ammonia, the reaction product will be $[TiCl_4(NH_3)_4]$. While suitable titanium nitride films may be achieved using this compound as the single source, the resultant films have been shown to contain some residual ammonium chloride. Since this contamination is somewhat undesirable, it has been found that superior films may be achieved with the use of a single source precursor having the formula $TiCl_4(NH_3)_2$. Those skilled in the art will appreciate that the mechanism explaining this phenomenon is somewhat unclear. However it has been demonstrated that superior titanium nitride films are produced when $TiCl_4(NH_3)_2$ is used as the single source. This complex is prepared by subliming $[TiCl_4(NH_3)_4]$ at 100° C. to yield a bright yellow powder.

Other suitable single sources are the complexes $[TiCl_4(NHEt_2)_2 \cdot (NHEt_2)_{0.33}]$ and $[TiCl_4(NHi-Pr_2)_2]$. These compounds are respectively prepared by the reaction of titanium tetrachloride with the secondary amine $NHR_2$, wherein R is respectively an ethyl group and isopropyl group.

However, of the four single source precursors disclosed above, $[TiCl_4(NH_3)_2]$ is most preferred.

Preferably, 50 to 200 milligrams of the single source will be utilized to provide a 100 Angstroms to 5 micron thick film on a substrate 2 centimeters by 5 centimeters in size.

Turning to FIG. 1, the single source precursor 2 will be deposited in the closed end 4 of sealed quartz tube 6. Glass tubes have insufficient strength at the higher temperatures used herein.

Using heat source 8, single source 2 is sublimed. Heat source 8 will provide a temperature from 25° to 300° C. at a pressure selected from a range of about 0.0001 to 760 torr. Most preferably, heat source 8 will supply a temperature of between 50° to 100° C. and most preferably between 80° to 100° C. and at a pressure selected from a range of about 0.01 to 1.0 torr.

The sublimate of single source 2 is delivered to a reaction zone 10. The reaction zone 10 is comprised of that section of the quartz tube 6 arrayed within a furnace 12.

Furnace 12 heats reaction zone 10 to a temperature selected from a range of about 200° to 800° C. Most preferably, the reaction zone will be heated to a temperature selected from a range of about 400° to 800° C. Disposed within reaction zone 10 of quartz tube 6 is a ceramic stage 14 upon which the desired substrate 16 has been placed.

Substrate 16 may be comprised of glass, steel or silicon. Steel may be defined as a non containing alloy. Low sodium glass is particularly suitable as is stainless steel. An example of a suitable glass is Corning 7059. Preferably, however the substrate will be silicon and most preferably will be individual sheets of monocrystalline silicon. Suitable silicon may be obtained from Mattheson Scientific of Detroit, Mich.

Typical substrates are normally in the range of 2 centimeters by 5 centimeters, although larger pieces are possible.

Upon the passing over of sublimed source 2, substrate 16 is coated with a thin film of a metal pnictogenide.

If desired a stream of inert gas such as nitrogen may be introduced at port 18 to assist in the flow of sublimed source 2 through the quartz tube 6.

After exiting reaction zone 10 sublimed source 2 exits quartz tube 6 to exit the system through vacuum pump 22. The following examples are provided to illustrate the invention and are not intended to limit the invention. It is anticipated that those skilled in the art will understand that other reactor configurations are possible. All degrees are in centigrade and all parts are by weight percent unless otherwise indicated.

EXAMPLE 1

Preparation of $[TiCl_4(NH_3)_4]$.

A 1-liter three-necked flask was charged with titanium tetrachloride (3.00 mL, 27.4 mmol), dichloromethane (120 mL), and a stir bar. The flask was fitted with a rubber septum, a gas inlet tube, and a gas outlet tube connected to an oil bubbler. The solution was cooled to −78° C. and anhydrous ammonia bubbled through the solution for 0.5 h. The resultant yellow suspension was allowed to warm to ambient temperature and was stirred for 1.0 h. Once all ammonia had evolved, the solvent was removed under reduced pressure to afford a bright yellow solid (6.14 g, 87% based upon titanium tetrachloride): decomposition temperature range (obtained with standard melting point tube, heated block and thermometer) 210°–240° C.; IR Sample dispersed in mineral oil (nujol), results obtained on a Nicolet DX20 infrared spectrophotometer (cm-1) 3308 (s), 3239 (s), 3137 (s), 3040 (s), 2000 (w), 1759 (m), 1657 (w), 1593 (s), 1399 (vs), 1255 (s), 1233 (s), 1094 (w), 976 (s), 901 (m), 874 (m), 799 (w). Those skilled in the art will appreciate that the preceding numbers and the letter s in ( ) respectively refer to peak positions and intensities.

Combustion analysis measuring actual mass percentages versus theoretical mass percentages for $H_{12}N_4Cl_4Ti$: Theoretical mass percentages: H, 4.69; N, 21.73; Cl, 55.00. Actual mass percentages: H, 4.95; N, 21.51; Cl, 61.89.

EXAMPLE 2

Preparation of $[TiCl_4(NH_3)_2]$.

Complex $[TiCl_4(NH_3)_4]$ (0.25 g. 0.97 mmol) was placed in a sublimation tube and was sublimed at 100° C. (0.01 mmHg) to yield a bright yellow powder (0.168 g, 77%): mp 240° C. (dec); IR (nujol, cm-1) 3318 (s), 3231 (s), 3144 (s), 3046 (w), 1591 (m), 1400 (s), 1255 (s), 1238 (s), 851 (w), 678 (m).

Anal. Calcd for $H_6N_2Cl_4Ti$ H, 2.70; N, 12.52; Cl, 63.37. Found: H, 2.90; N, 12.73; Cl, 64.28.

EXAMPLE 3

Deposition of Titanium Nitride Films Using $[TiCl_4(NH_3)_4]$ or $[TiCl_4(NH_3)_2]$.

A 1-meter, 25 mm id quartz tube was loaded with $[TiCl_4(NH_3)_4]$ or $[TiCl_4(NH_3)_2]$ (ca. 0.10 g). The single source was positioned at the end of the tube and a 5 mm×20 mm glass or silicon substrate was positioned in the tube at a point 5 to 25 cm from the single source. A vacuum was established (ca. 0.01 mmHg) and the tube was placed in a preheated 600° C. tube furnace. The end of the tube containing the precursor was placed outside of the furnace, but this section of the tube was wrapped with heating tape. The heating tape was warmed to ca. 100° C., whereupon the precursor sublimed into the 600° C. section over ca. 5 min. At this point, the tube was removed from the furnace and allowed to cool to ambient temperature. The substrates were coated with highly reflective gold-colored films of titanium nitride. X-ray diffraction of the film showed it to be a single crystallographic orientation ($2\theta = 42.5°$) of titanium nitride. X-ray photoelectron spectroscopy showed a titanium:nitrogen ratio of 1:1 and revealed chlorine levels of <1%. The resistivity of the film was 550 microhm-cm.

EXAMPLE 4

Preparation of $[TiCl_4 (NHEt_2)_{0.33}]$.

A 1000-mL Schlenk flask was charged with diethylamine (0.977 mL, 9.44 mmol), dichloromethane (20 mL), and a stir bar and was fitted with a rubber septum. The solution was cooled to −78° C. and then titanium tetrachloride (0.130 mL, 1.18 mmol) was added by syringe. The mixture was allowed to warm to ambient temperature over 0.5 h. The solvent and other volatile components were removed under reduced pressure. The residue was dissolved in dichloromethane (15 mL) and hexane (85 mL) was carefully layered on the dichloromethane. The system was allowed to equilibrate at ambient temperature for 24 h. The solvent was removed by cannula and the resultant residue was vacuum dried to afford emerald green square rods (0.287 g, 67% based upon titanium tetrachloride): mp 72°–73° C. dec.; IR (nujol, cm$^{-1}$) 3098 (m), 1562 (m), 1294 (m), 1154 (w), 1126 (w), 1055 (m), 984 (w), 872 (w), 787 (m), 766 (m), 717 (m); $^1$H NMR (CDCl$_3$, δ, 22° C.) 3.13 (q,J=2.3 Hz, TiNH(CH$_2$CH$_3$)$_2$), 1.33 (t,J=2.3 Hz, TiNH(CH$_2$CH$_3$)), TiNH(CH$_2$CH$_3$)$_2$ not observed; $^{13}$C{$^1$H} NMR (CDCl$_3$, ppm, 22° C.) 42.92 (s, TiNH(CH$_2$CH$_3$)$_2$), 11.34 (s, TiNH(CH$_2$CH$_3$)$_2$).

Anal. Calcd for C$_8$H$_{22}$Cl$_4$N$_2$Ti·(C$_4$H$_{11}$N)$_{0.33}$: C, 31.11; H, 7.18; N, 9.07. Found: C, 31.29; H, 7.61; N, 9.07.

EXAMPLE 5

Preparation of [TiCl$_4$(NHi-Pr$_2$)$_2$].

In a fashion similar to the preparation of [TiCl$_4$(NHEt$_2$)$_2$·(NHEt$_2$)$_{0.33}$], diisopropylamine (0.650 mL, 4.72 mmol) and titanium tetrachloride (0.130 mL, 1.18 mmol) were reacted to afford red-purple square rods after crystallization from dichloromethane/hexane (0.308 g, 67% based upon titanium tetrachloride): mp 182° C. dec; IR (nujol, cm$^{-1}$) 3141 (m), 3100 (s), 3031 (s), 1569 (m), 1418 (m), 1392 (m), 1359 (m), 1340 (m), 1182 (m), 1159 (m), 1139 (m), 1121 (m), 1089 (m), 981 (w), 942 (w), 910 (w), 819 (m); $^1$H NMR (CDCl$_3$, , 22° C.) 4.35 (m, TiNH(CH(CH$_3$)$_2$)$_2$), 3.48 (m, TiNH(CH(CH$_3$)$_2$)$_2$), 1.50 (t,J=6.3 Hz, TiNH(CH(CH$_3$)$_2$)$_2$); $^{13}$C($^1$H) NMR (CDCl$_3$, ppm, 22° C.) 48.07 (s, TiNH(CH(CH$_3$)$_2$)$_2$), 19.37 (s, TiNH(CH(CH$_3$)$_2$)$_2$).

Anal. Calcd for C$_{12}$H$_{30}$Cl$_4$N$_2$Ti: C, 36.76; H, 7.71; N, 71.4. Found: C, 36.45; H, 7.73; N, 7.10.

EXAMPLE 6

Deposition of Titanium Nitride Films Using [TiCl$_4$(NHEt$_2$)$_2$·(NHEt$_2$)$_{0.33}$] and [TiCl$_4$(NHi-Pr$_2$)$_2$].

A 1-meter, 25 mm id quartz tube was loaded with [TiCl$_4$(NHEt$_2$)$_2$·(NHEt$_2$)$_{0.33}$] or [TiCl$_4$(NHi-Pr$_2$)$_2$)] (ca. 0.10 g). The precursor was positioned at the end of the tube and a 5 mm×20 mm glass or silicon substrate was positioned in the tube at a point 5–25 cm from the precursor. A vacuum was established (ca. 0.01 mmHg) and the tube was placed in a preheated 600° C. tube furnace. The end of the tube containing the precursor was placed outside of the furnace, but this section of the tube was wrapped with heating tape. The heating tape was warmed to ca. 100° C., whereupon the precursor sublimed into the 600° C. section over ca. 5 min. At this point, the tube was removed from the furnace and was allowed to cool to ambient temperature. The substrates were coated with highly reflective gold-colored films of titanium nitride. X-ray diffraction of the film showed it to be a single crystallographic orientation (42.5°) of titanium nitride.

As is apparent from the foregoing descriptions, the process for depositing thin films of metal pnictogenide using single sources according to the present invention has several advantages.

While the best modes for carrying out the invention have been described in detail, those familiar with the art to which the invention relates will recognize various alternative designs and embodiments for practicing the invention as defined by the following claims.

We claim:

1. A CVD process for depositing a film of a metal pnictogenide comprising the steps of:
   providing a single source capable of forming the metal pnictogenide;
   heating the single source to a temperature sufficient to sublime the single source at a pressure of about 0.0001 to 760 torr so that a sublimate is delivered into a reaction zone;
   providing a substrate within the reaction zone;
   heating the reaction zone to a temperature of about 200–800 degrees C; and
   passing the sublimate over the substrate to deposit a film of the metal pnictogenide on the substrate.

2. The process of claim 1 wherein the step of providing a single source comprises providing the reaction product of MX$_n$ and a reactant selected from the group consisting of NH$_3$, NHR$_2$, NR$_3$ and mixtures thereof, wherein M is selected from the group consisting of Ti, Zr, Hf, V, Nb, Ta, Cr, Mo, and W, n is a number from 3 to 6, X is a halide, and R is a substituent group containing from 1 to 18 carbon atoms.

3. The process of claim 2 wherein the step of providing a single source comprises providing the reaction product of TiX$_4$ and a reactant selected from the group consisting of NH$_3$, NHR$_2$, NR$_3$ and mixtures thereof, wherein X is a halide, and R is a substituent selected from the group consisting of a primary, secondary, or tertiary butyl.

4. The process of claim 3 wherein the step of providing a single source comprises providing a reaction product of TiCl$_4$ and NH$_3$.

5. The process of claim 4 wherein the step of providing a single source comprises providing the single source having the formula TiCl$_4$(NH$_3$)$_2$.

6. The process of claim 4 wherein the step of providing a single source comprises providing the single source having the formula TiCl$_4$(NH$_3$)$_4$.

7. The process of claim 3 wherein the step of providing the single source comprises providing a reaction product of TiCl$_4$ and NHR$_2$ wherein R is an alkyl group selected from the group consisting of C$_n$H$_{2n+1}$ wherein n is from 1 to 5.

8. The process of claim 7 wherein the step of providing the single source comprises providing [TiCl$_4$(NH(CH$_2$CH$_3$)$_2$)$_2$·(NH(CH$_2$CH$_3$)$_2$)$_{0.33}$].

9. The process of claim 7 wherein the step of providing the single source comprises providing [TiCl$_4$(NH((CH$_3$)$_2$CH)$_2$)$_2$].

10. The process of claim 1 wherein the step of heating the single source comprises heating the single source to a temperature selected from a range of about 80 to 100 degrees C.

11. The process of claim 10 wherein the step of heating the single source is performed at a pressure selected from a range of about 0.01 to 1.0 torr.

12. The process of claim 1 wherein the step of providing a substrate comprises providing a substrate selected from the group consisting of silicon, glass and steel.

13. The process of claim 1 wherein the step of heating the reaction zone comprises heating the reaction zone to a temperature selected from a range of about 400 to 800 degrees C.

14. The process of claim 1 wherein the step of passing the sublimate over the substrate further comprises passing the sublimate over the substrate so as to deposit a metal pnictogenide film from 100 Angstroms to 5 microns thick.

15. The process of claim 1, wherein the single source is $TiCl_4(NH_3)_2$ and the metal pnictogenide of which the film is composed is TiN.

16. A CVD process for depositing a film of a metal pnictogenide comprising the steps of:
   providing a single source which is the reaction product of $MX_n$ and a reactant selected from the group consisting of $NH_3$, $NHR_2$, $NR_3$ and mixtures thereof, wherein M is selected from the group consisting of Ti, Zr, Hf, V, Nb, Ta, Cr, Mo, and W, n is a number from 3 to 6, X is a halide, and R is a substituent selected from the group consisting of a primary, secondary, or tertiary butyl;
   heating the single source to a temperature of about 80–100 degrees C at a pressure of about 0.01 to 1.0 torr so that a sublimate is delivered into a reaction zone;
   providing a substrate within the reaction zone;
   heating the reaction zone to a temperature of about 400–800 degrees C; and
   passing the sublimate over the substrate to deposit a film of the metal pnictogenide on the substrate.

17. A CVD process for depositing a film of titanium nitride comprising the steps of:
   providing a single source capable of forming titanium nitride;
   heating the single source to a temperature of about 80–100 degrees C so as to sublime the single source at a pressure of about 0.01 to 1.0 torr so that a sublimate is delivered into a reaction zone;
   providing a substrate within the reaction zone;
   heating the reaction zone to a temperature of about 400 to 800 degrees C; and
   passing the sublimate over the substrate so as to deposit on the substrate a film of titanium nitride from 100 Angstroms to 5 microns thick.

* * * * *